United States Patent

Blum et al.

[11] Patent Number: 6,103,451
[45] Date of Patent: Aug. 15, 2000

[54] MULTILAYER ELEMENT FOR PRODUCING PRINTING OR RELIEF PLATES

[75] Inventors: Rainer Blum, Ludwigshafen; Sabine Philipp, Mörfelden-Walldorf; Alfred Leinenbach, Gönnheim, all of Germany

[73] Assignee: BASF Drucksysteme GmbH, Stuttgart, Germany

[21] Appl. No.: 09/157,599

[22] Filed: Sep. 21, 1998

[30] Foreign Application Priority Data

Oct. 1, 1997 [DE] Germany ............... 197 43 507

[51] Int. Cl.$^7$ ........................................... G03F 7/11
[52] U.S. Cl. ........................................... 430/271.1
[58] Field of Search ........................................... 430/271.1

[56] References Cited

U.S. PATENT DOCUMENTS

| | | | |
|---|---|---|---|
| 4,126,466 | 11/1978 | Roos | 96/84 |
| 4,238,561 | 12/1980 | Grossa et al. | 430/253 |
| 4,289,843 | 9/1981 | Boutle et al. | 430/271.1 |
| 4,320,188 | 3/1982 | Heinz et al. | 430/281.1 |
| 4,323,636 | 4/1982 | Chen | 430/271.1 |
| 4,459,348 | 7/1984 | Jun et al. | 430/271.1 |
| 5,756,255 | 5/1998 | Sato et al. | 430/270.1 |
| 5,886,102 | 3/1999 | Sinta et al. | 525/154 |

FOREIGN PATENT DOCUMENTS

| | | |
|---|---|---|
| 0 634 696 | 1/1995 | European Pat. Off. |
| 2138582 | 2/1972 | Germany . |
| 2215090 | 10/1972 | Germany . |
| 2942183 | 5/1981 | Germany . |
| 19600155 | 7/1997 | Germany . |
| 19707478 | 8/1998 | Germany . |
| 1358062 | 6/1974 | United Kingdom . |

*Primary Examiner*—Cynthia Hamilton
*Attorney, Agent, or Firm*—Keil & Weinkauf

[57] ABSTRACT

A multilayer element comprising a substrate, an intermediate layer and a photopolymerizable or photocrosslinkable layer in the stated order is used for producing printing or relief plates. The intermediate layer contains a copolymer of a monomer (A) of the formula (I) or (II) and a copolymerizable monomer (B)

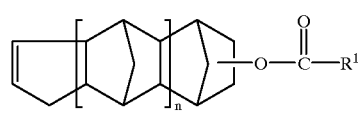

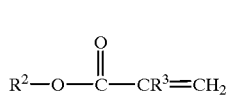

where $R^1$ is vinyl, propen-2-yl, 1-buten-2-yl or styryl or a radical $R^2$—O—CO—CH=CH—, $R^2$ is an alkyl, aryl, aralkyl or cycloalkyl radical of up to 10 carbon atoms, $R^3$ is H, methyl or ethyl and n is from zero to 5. The intermediate layer in the multilayer element has improved adhesion in the laminate. It is initially nontacky and does not become tacky until after the application of the photopolymerizable layer, as a result of the interaction with said layer. The improved adhesion in the laminate is retained even after storage and repeated use of the finished printing plates.

8 Claims, No Drawings

MULTILAYER ELEMENT FOR PRODUCING PRINTING OR RELIEF PLATES

The invention relates to a multilayer element for producing printing or relief plates, comprising a substrate, an adhesion-promoting intermediate layer and a photopolymerizable or photocrosslinkable layer in the stated order.

Multilayer elements for producing printing or relief plates generally have photopolymerizable or photocrosslinkable layers which are firmly bonded to dimensionally stable substrates of metal foils or plastics films. The photopolymerizable layer contains in general a polymeric binder, a polymerizable ethylenically unsaturated compound and an initiator capable of initiating the polymerization of the ethylenically unsaturated compound on exposure to actinic light, and, if required, an antihalation agent which may also be contained in a separate layer. A negative is applied to the photopolymerizable layer and exposed to light. The exposed parts of the layer become insoluble and unexposed parts are washed out with a suitable solvent. A relief printing plate is obtained. Such printing plates are known and are described, inter alia, in DE-A 21 38 582 or U.S. Pat. No. 4,459,348.

For example, U.S. Pat. No. 4,459,348 describes such multilayer elements having an adhesion-promoting intermediate layer between substrate and photopolymerizable layer. The photopolymerizable layer is a mixture of an elastomeric binder, which contains a two-block copolymer of the type A-B, a three-block copolymer of the type A-B-A having, for example, thermoplastic styrene polymer blocks A and elastomeric butadiene or isoprene polymer blocks B, or elastomeric three-block copolymers of the type A-B-C, as also described as a binder in DE-A 29 42 183, and a photopolymerizable, ethylenically unsaturated monomer compatible with the elastomeric binder, for example an ester of acrylic acid with a monohydric or polyhydric alcohol, and a suitable polymerization initiator. Moreover, further additives, such as thermal polymerization inhibitors, may be present. The adhesion-promoting intermediate layer between the substrate the photopolymerizable layer consists of a polyisocyanate-cured and crosslinked hydroxyl-containing polyurethane resin or polyester resin, a polyether resin, a hydroxyl-containing epoxy resin or, preferably, a hydroxyl-containing phenoxy resin. Although a substantial improvement in the adhesion in multilayer elements is achieved by means of the adhesion-promoting intermediate layer as described, in practice the adhesion is lost during storage.

DE-A 22 12 090 likewise describes multilayer elements for the production of relief plates. The photosensitive materials used there have a surface tack. A separate, adhesion-promoting intermediate layer is not described.

DE-A 29 42 183 relates to photopolymerizable mixtures for producing relief plates for flexographic printing which contain three-block copolymers A-B-C as binders. When such photopolymerizable printing plates containing acrylic or methacrylic esters are exposed to light, the result, with admission of oxygen, is a surface tack which can be utilized for the adhesion promotion and can be enhanced by tackifiers, such as hydrocarbon resins, polyterpenes, cumarone/indene resins and the like. An elastomeric lower layer under the photopolymerizable layer is regarded as advantageous and consists of the same material as said photopolymerizable layer and can be brought to a hardness adapted to the printing behavior by means of added plasticizers. The lower layer can be photocrosslinked by total exposure.

The nonprior published, earlier DE-A 196 00 155 describes polyfunctional polymeric substances which contain structural units of dihydrodicyclopentadiene or of its oligomers, these structural units being linked to the polymer main chain, for example, via ether, ester, urethane, amide, ketone or C—C bonds. The polymers are suitable as binders for various applications.

The nonprior published, earlier DE-A 197 07 478 describes unsaturated polyesters having structural units which contain radicals of dihydrodicyclopentadiene and unsaturated dicarboxylic acids or anhydrides thereof. These unsaturated polyesters are used as impregnating and coating solutions.

The nonprior published, earlier DE-A 197 07 492 describes polyester resin materials or solutions which contain unsaturated or saturated polyesters comprising structural units having radicals of dihydrodicyclopentadiene and which are used for coating moldings.

It is an object of the present invention to provide multilayer elements for producing printing and relief plates, which are to contain an intermediate layer having improved adhesion in the laminate. The intermediate layer should be nontacky and should become tacky after application of the relief-forming layer owing to the resulting interactions. The adhesion in the laminate should be retained after storage and repeated use of the finished printing plates.

We have found that this object is achieved by a multilayer element comprising a substrate, an intermediate layer and a photopolymerizable or photocrosslinkable layer in the stated order, for producing printing or relief plates. In the novel multilayer element, the intermediate layer contains a copolymer of a monomer (A) of the formula (I) or (II) and a copolymerizable monomer (B)

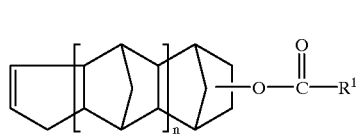
(I)

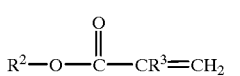
(II)

where $R^1$ is vinyl, propen-2-yl, 1-buten-2-yl or styryl or a radical $R_2$—O—CO—CH=CH—, $R^2$ is an alkyl, aryl, aralkyl or cycloalkyl radical of up to 10 carbon atoms, $R^3$ is H, methyl or ethyl and n is from zero to 5, preferably zero or 1.

The monomer (A) used is a dihydrodicyclopentadienyl derivative of the formula (I), preferably dihydrodicyclopentadienyl acrylate, dihydrodicyclopentadienyl methacrylate, dihydrodicyclopentadienyl ethacrylate, dihydrodicyclopentadienyl cinnamate, dihydrodicyclopentadienyl monomaleate, dihydrodicyclopentadienyl monofumarate, bis(dihydrodicyclopentadienyl) maleate or bis (dihydrodicyclopentadienyl) fumarate, in particular dihydrodicyclopentadienyl acrylate or dihydrodicyclopentadienyl methacrylate.

The dihydrodicyclopentadienyl ester of the formula (I) where n is from 0 to 5 is prepared by an addition reaction of dicyclopentadiene with the unsaturated acid $R_1$—COOH. For example, dihydrodicyclopentadienyl acrylate is prepared by an addition reaction of the corresponding dicyclopentadiene with acrylic acid.

Dihydrodicyclopentadienyl radicals where n is from 0 to 5 are preferably formed in situ from cyclopentadiene or dicyclopentadiene by a graft reaction at above 130° C. preferably above 170° C.

Preferably, an acrylate of the formula (II) may also be used as monomer (A). Preferred acrylates here are those which form a homopolymer having a $T_g$ value of >30° C. A copolymer comprising such acrylates has tack only above room temperature or, according to the invention, an interaction with other layers. Methyl methacrylate and tert-butyl acrylate are particularly preferably used.

The copolymer contains units of the comonomer (B), which is of the formula (III) or (IV)

$$R^1\text{—}CO\text{—}OR^4 \quad (III)$$

$$R^1\text{—}CO\text{—}NR^5R^6 \quad (IV)$$

where $R^4$ is H, unsubstituted or substituted alkyl of 1 to 30 carbon atoms or an alicyclic, araliphatic or heterocyclic radical and $R^5$ and $R^6$ are identical or different and are each H, hydroxylalkyl or alkyl of 1 to 30 carbon atoms or alkoxymethyl of up to 12 carbon atoms. If $R^4$ is substituted alkyl, this may contain a polymerizable or crosslinkable group. Units of the comonomer (B) of the formula (III) are preferably used, in particular methyl methacrylate or butyl acrylate.

For modifying its hardness, the copolymer may contain units of monomers (B) which have a $T_g$ value suitable for this purpose and may be incorporated in an amount of from 0 to 10% as polymerized units in the copolymer. Inter alia, a vinylaromatic compound, for example styrene, may be used as the hardening compound or ethylhexyl acrylate, n-butyl acrylate, dodecyl acrylate or tridecyl acrylate may be used as plasticizing compounds.

Intermediate layers for the multilayer elements according to the invention are preferably obtained using copolymers which contain from 5 to 30% of the monomer (A), from 60 to 95% of comonomer (B) and from 0 to 10% of a further compound having polymerizable ethylenically unsaturated radicals for modifying the hardness of the copolymer.

A particularly preferred embodiment of the copolymer contains from 10 to 25% of units of comonomer (A), from 65 to 90% of units of the comonomer (B) and from 0 to 10% of units of the hardening or plasticizing compound.

The copolymers for the production of the intermediate layer described are obtained by free radical solution polymerization in a manner known per se. The molecular weight of the comonomers can be controlled within a specific range by reaction conditions known to a person skilled in the art, such as the choice of suitable solvents, the type and amount of the free radical initiators and any polymerization regulator which may be concomitantly used. Preferably, the degree of polymerization is adjusted to give K values of from 10 to 80, particularly preferably from 15 to 30.

For the production of the intermediate layer in the novel multilayer element from polyacrylate resins, said layer is preferably applied to the substrate from solution or dispersion and then dried to give nontacky layers. After application of the relief-forming layer, the nontacky polymeric intermediate layers become adhesive and tacky as a result of an interaction with this layer and thus form a stable laminate. This change from nontacky to tacky makes it possible to coat carrier materials with the intermediate layer and then to store them in rolled up form without them sticking together and to apply the relief-forming layer at a later time.

Multilayer elements which contain the intermediate layer described can moreover be composed of rigid or flexible substrates and hard to highly resilient photopolymerizable or photocrosslinkable layers. It may be advantageous to adapt the resilience of the intermediate layer to the total resilience of the multilayer element.

Furthermore, for modifying the hardness, unsaturated hydrocarbon resins (eg. Escopol® and Escorez® resins from ESSO), as hardening compounds, or unsaturated oils, fats, fatty acids or fatty esters, as plasticizing compounds, may be mixed with the copolymer.

At least one layer of the multilayer element may contain an antihalation agent. Suitable antihalation agents are UV-absorbing substances, for example Michler's ketone and its derivatives.

The photopolymerizable or photocrosslinkable layers are produced in a known manner. Elastomeric or hard photopolymerizable or photocrosslinkable layers are suitable. The photopolymerizable or photocrosslinkable layer may contain, in a known manner, assistants such as photoinitiators, polymerization inhibitors, dyes, photochromic substances, antioxidants, surfactants, viscosity regulators or plasticizers. The photopolymerizable or photocrosslinkable layers are applied to conventional substrates of polyester, aluminum or steel. These substrates may additionally be surface-treated, for example by corona discharge, chemical etching or mechanical roughening.

Known production processes are, for example, the successive casting of the intermediate layers and of the photopolymerizable or photocrosslinkable layer from solutions onto the substrate, or the coating of the substrate with the intermediate layer and subsequent application of the photopolymerizable or photocrosslinkable layer from solution or as extrudable material.

The preferred method of application of the intermediate layer is casting from solution. The intermediate layer has a thickness of from 2 to 50 μm, preferably from 5 to 20 μm, in particular from 5 to 10 μm.

In the examples which follow, solutions for the production of a novel adhesion-promoting intermediate layer are described. The stated amounts correspond to parts by weight (p), and percentages and ratios are by weight.

EXAMPLE 1

240 p of ethyl acetate and isopropanol were initially taken in a flask provided with a stirring apparatus, a thermometer, a reflux condenser and two feed vessels. The first feed vessel contained a mixture of:

190 p of butyl acrylate
100 p of dihydrodicyclopentadienyl acrylate
190 p of styrene
20 p of acrylic acid and the second feed vessel contained a solution of:

120 p of methyl isopropyl ketone
30 p of benzoyl peroxide

The initially taken mixture was heated to about 80° C. On reaching the temperature, the addition of the contents of the two feed vessels was begun simultaneously, the content of feed 1 being added in the course of 2 hours and the content of feed 2 in the course of 2.5 hours. The mixture was then kept at 80° C. for one hour. Thereafter, the solvent was distilled off and the residue was taken up in tetrahydrofuran until a 10% strength solution was obtained.

EXAMPLE 2

The reaction was carried out similarly to Example 1, except that the first feed vessel contained the following mixture:

190 p of butyl acrylate 50 p of methyl methacrylate 240 p of styrene 20 p of acrylic acid

EXAMPLE 3

The reaction was carried out similarly to Example 1, except that the first feed vessel contained the following mixture:

190 p of butyl acrylate 50 p of tert-butyl acrylate 240 p of styrene 20 p of acrylic acid Comparative Example:

For the comparative tests, a mixture of adhesive-forming components which is described in EP-B 0 055 807 and has the following composition was used:

75 p of phenoxy resin (PKHH® from Union Carbide Corp.) and 25 p of polycarbonate (Makrolon 2800® from BAYER AG) were dissolved in 900 p of tetrahydrofuran. Immediately before use, 35 p of a polyisocyanate (Desmodur L® from BAYER AG) were mixed with this solution.

EXAMPLE 4

40 p of a solution according to Example 1 were mixed with 60 p of a solution from the comparative example. The resulting solution is suitable for the formation of the intermediate layer and has a higher solvent resistance than Example 1.

The photopolymerizable layer has been described in DE-A 2 942 183 and was produced in a kneading apparatus as a homogeneous mixture of the following components:

85 p of ABC block copolymer [A: polystyrene, B: polyisoprene, C: poly(styrene/butadiene)]

5 p of hexanediol diacrylate 2 p of trimethylolpropane triacrylate 1 p of benzil dimethyl ketal 1 p of 2,6-di-tert-butyl-p-cresol 5 p of light mineral oil (white oil)

Production of the test samples:

The solutions described in Examples 1 to 4 and the comparative example were present as a 10% strength solution of adhesion-promoting components in tetrahydrofuran. The solutions of the examples and of the comparative example for the intermediate layer were applied in a layer thickness of 20 μm to 125 μm thick polyethylene terephthalate film by means of a continuous coater in a continuously operated pilot plant. The films coated in this manner were dried at 130° C. for two minutes in a hot-air tunnel. The coatings then had a thickness of about 5 μm, were nontacky and could be rolled up. Even after a storage time of two months, the films could be unwound from the roll without sticking together.

After storage for one week, the photopolymerizable mixture described above was extruded, by means of a sheet extruder at 130° C., onto the films precoated with the mixtures of adhesion-forming components and, immediately after the extrusion, said films and said mixture were pressed together by means of a calender.

Testing of the adhesive strength:

The laminate produced was exposed for about 15 minutes to UV-A light (intensity maximum at wavelength of about 360 nm and a power of 40 watt). 2 cm wide strips of the exposed laminates were cut and the film was separated from the relief-forming layer at one end. The separated ends of the strip were clamped in a tensile tester and the adhesive force in N/cm between the mixture of adhesion-promoting components and the photopolymerizable layer was measured at an angle of 90°.

| Test | Example | | | | |
|---|---|---|---|---|---|
| Adhesive force [N/cm] | 1 | 2 | 3 | 4 | Comparison |
| Immediate after extrusion | 4.3 | 1.8 | 2.9 | 4.8 | 3.8 |
| 1 day after extrusion | 7.7 | 4.7 | 5.3 | 7.3 | 4.6 |
| 10 days after extrusion | 7.7 | 5.1 | 7.0 | 6.8 | 4.1 |
| 100 days after extrusion | 8.2 | 4.9 | 6.4 | 7.7 | 0.7 |

The tack was assessed by a manual finger test on the based intermediate layer of an unexposed laminate.

| Test | Example | | | | |
|---|---|---|---|---|---|
| Tack | 1 | 2 | 3 | 4 | Comparison |
| Immediately after extrusion | slightly tacky | slightly tacky | slightly tacky | nontacky | nontacky |
| 1 day after extrusion | highly tacky | highly tacky | highly tacky | tacky | nontacky |
| 10 days after extrusion | highly tacky | highly tacky | highly tacky | highly tacky | nontacky |
| 100 days after extrusion | highly tacky | highly tacky | highly tacky | highly tacky | nontacky |

We claim:

1. A multilayer element comprising a substrate, an intermediate layer and a photopolymerizable or photocrosslinkable layer in the stated order for producing printing or relief plates, wherein the intermediate layer contains a copolymer of a monomer (A) of the formula (I) and a copolymerizable monomer (B)

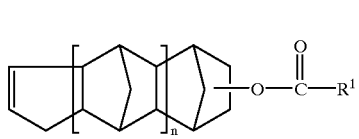

(I)

where $R^1$ is vinyl, propen-2-yl, 1-buten-2-yl or styryl or a radical $R^2$—O—CO—CH=CH—, $R^2$ is an alkyl, aryl, aralkyl or cycloalkyl radical of up to 10 carbon atoms and n is from zero to 5.

2. A multilayer element as claimed in claim 1, wherein n is zero or 1.

3. A multilayer element as claimed in claim 1, wherein the comonomer (B) is of the formula (III) or (IV)

where $R^4$ is H, unsubstituted or substituted alkyl of 1 to 30 carbon atoms or an alicyclic, araliphatic or heterocyclic radical and $R^5$ and $R^6$ are identical or different and are each H, alkyl of 1 to 30 carbon atoms or alkoxymethyl of up to 12 carbon atoms.

4. A multilayer element as claimed in claim 3, where in $R^4$ is substituted alkyl which contains a polymerizable or crosslinkable ethylenically unsaturated group.

5. A multilayer element as claimed in claim 1, wherein the comonomer (B) contains radicals for modifying the hardness of the copolymer.

6. A multilayer element as claimed in claim 1, wherein the intermediate layer additionally contains compounds for modifying the hardness of the copolymer.

7. A multilayer element as claimed in claim 1, wherein the intermediate layer has a thickness of from 2 to 50 $\mu$m.

8. A multilayer element as claimed in claim 1, wherein the photopolymerizable layer contains a polymeric binder, a polymerizable ethylenically unsaturated compound and a photoinitiator which, on exposure to actinic light, is capable of initiating the polymerization of the ethylenically unsaturated compound.

* * * * *